(12) United States Patent
Bock

(10) Patent No.: US 7,132,858 B2
(45) Date of Patent: Nov. 7, 2006

(54) LOGIC CIRCUIT

(75) Inventor: Holger Bock, Graz (AT)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 11/018,404

(22) Filed: Dec. 20, 2004

(65) Prior Publication Data
US 2005/0134319 A1   Jun. 23, 2005

Related U.S. Application Data

(63) Continuation of application No. PCT/EP2003/006260, filed on Jun. 13, 2003.

(30) Foreign Application Priority Data
Jun. 20, 2002  (DE) ................. 102 27 618

(51) Int. Cl.
*H03K 19/00* (2006.01)
*H03L 7/00* (2006.01)
(52) U.S. Cl. ................. 326/93; 326/94; 327/141
(58) Field of Classification Search .............. 326/93, 326/94, 104; 327/141, 161, 261, 262, 269
See application file for complete search history.

(56) References Cited

U.S. PATENT DOCUMENTS

| | | | |
|---|---|---|---|
| 4,570,084 A | 2/1986 | Griffin et al. | |
| 5,198,708 A * | 3/1993 | Gillingham | 326/93 |
| 5,305,463 A | 4/1994 | Fant et al. | |
| 5,724,287 A * | 3/1998 | Takenaka | 365/191 |
| 5,852,378 A * | 12/1998 | Keeth | 327/171 |
| 6,313,662 B1 | 11/2001 | Ide | |
| 6,373,288 B1 * | 4/2002 | Ganzelmi et al. | 326/93 |
| 6,384,658 B1 * | 5/2002 | Jex | 327/295 |

FOREIGN PATENT DOCUMENTS

| | | |
|---|---|---|
| DE | 199 22 354 A1 | 5/2000 |
| EP | 0 172 229 B1 | 2/1986 |

(Continued)

OTHER PUBLICATIONS

Gerald E. Sobelman & Kart Fant; "CMOS Circuit Design of Threshold Gates With Hysteresis"; Circuits and Systems, 1998. ISCAS '98. Proceedings of the 1998 IEEE International Symposium in Monteray, CA, USA; May 31, 1998-Jun. 3, 1998, pp. 61-64.

(Continued)

Primary Examiner—James H. Cho
(74) Attorney, Agent, or Firm—Dickstein, Shapiro, LLP.

(57) ABSTRACT

A logic circuit includes an input for one or several input operands, an output for a result and an inverted result, a first circuit branch with a first logic assembly, which is coupled to the input and the output, to calculate the result, as well as a second circuit branch with a second logic assembly, which is coupled to the input and the output, to calculate the inverted result, wherein the first logic assembly and the second logic assembly have different run times for calculating the result and the inverted result, respectively. Further, a delay circuit and a compensation circuit, respectively, are provided in the first and/or second circuit branch to reduce a difference of the run times and the power consumptions, respectively, of the first and the second circuit branch.

24 Claims, 2 Drawing Sheets

| | FOREIGN PATENT DOCUMENTS | | | WO | WO-01/61914 A2 | 8/2001 |

| | | | |
|---|---|---|---|
| EP | 0 957 582 A1 | 11/1999 | |
| JP | 59-97230 | 6/1984 | |
| WO | WO-85/03817 A1 | 8/1985 | |
| WO | WO-99/67766 A2 | 12/1999 | |
| WO | WO-00/26746 A2 | 5/2000 | |
| WO | WO-00/70761 A1 | 11/2000 | |

OTHER PUBLICATIONS

Theseus Logic—Benefits of NCL—EMI; "Throw Away the Clock"; http://www.theseus.com/ aboutncl.htm. Dec. 14, 2004.

* cited by examiner

FIG 4 -PRIOR ART-

LOGIC CIRCUIT

CROSS-REFERENCE TO RELATED APPLICATION

This application is a continuation of copending International Application No. PCT/EP2003/006260, filed Jun. 13, 2003, which designated the United States, and was not published in English and is incorporated herein by reference in its entirety.

BACKGROUND OF THE INVENTION

1. Field of the Invention

The present invention relates generally to logic circuits and particularly to such logic circuits where two different circuit branches are connected between input and output to calculate a result and an inverted result in dependency on one or several inputs.

2. Description of Prior Art

Circuits of this type are used, for example, in circuits with a dual rail encoding or in circuits of the NCL (Null Convention Logic® (registered trademark)) of the company Theseus or in different circuits.

FIG. 4 generally shows the structure of such logic circuits based on an example of a logic device, which maps two input operands, A, B to one result operand C and outputs the result C as well as the inverted result $\overline{C}$. As can be seen from FIG. 4, the logic device, which is generally indicated with 300, consists of two inputs 302 and 304 for the input operands A and B, respectively, on the input side, of two outputs 306 and 308 for the result C and the inverted result $\overline{C}$, respectively, on the output side and in-between of two logic assemblies 310 and 312, each of which is coupled to both inputs 302 and 304, and the logic assembly 310 is coupled to the output 306, and the logic assembly 312 to the output 308.

The logic assemblies 310 and 312 are equalized to perform together a certain logic function with regard to the input operands A and B, such as an AND, OR or XOR function, or another complicated function. Accordingly, the logic assembly 310 is provided for calculating the result C from the input operands A and B, while the logic assembly 312 is provided to calculate the inverted result $\overline{C}$ from the input operands A and B. Depending on the type of logic function and the used gates within the logic assemblies 310 and 312, the selection of which, in turn, depends, for example, on the production technique used for the integration of the logic circuit, the logic assemblies 310 and 312 require different durations and different powers for the calculation of the result C and the inverted result $\overline{C}$, respectively. In other words, the logic assemblies 310 and 312 can have different run times and different power consumptions.

It is a disadvantage of the logic device described with reference to FIG. 4 that when using such logic devices in cryptographical circuits, such as chip cards or SIM cards, different run times and power consumption are caused, depending on the data to be encrypted within a logic device according to FIG. 4, which, in turn, present a potential for possible attacks, for example to draw conclusions about the used cryptography algorithm, the cryptographic key and other secret data. Attacks, which are suited for this, are referred to as hardware attacks, such as DPA (differential power analysis) and timing attacks. In the case that, for example, the logic device of FIG. 4 operates clocked within a synchronous logic, the course of the power consumption of the circuit changes within one clock, since, depending on the input data, more logic branches with that logic assembly switch to a logical high state, such as 5 V, as the result, and, in the case of a CMOS implementation, consume power thereby, which have a higher or lower power consumption and a longer or shorter run time, respectively, compared to the respectively different logic branches. In the case of the logic device of FIG. 4, for example, the power consumption as well as the time course of this power consumption differ for different input operands A and B depending on which of the two logic branches, namely the one into which the logic assembly 310 is switched or the one into which the logic assembly 312 is switched, outputs a logical high state as result and inverted result, respectively.

Even more serious is the effect of the different run times of power consumption of the different circuit branches of the different logic devices in the case of using them in asynchronous circuits as self-clocked logic devices. Depending on the data to be processed and to be encrypted, respectively, the different power consumptions and run times, which occur depending on which of the power branches "switches", add to a different total power consumption and total calculating duration per encryption or sub-operation of a cryptographical algorithm.

SUMMARY OF THE INVENTION

Therefore, it is an object of the present invention to provide a logic circuit, which obtains a higher security against hardware attacks.

In accordance with a first aspect, the invention provides a logic circuit, having: a first input for a first input operand; a second input for a second input operand; an output with a first partial output for a result and a second partial output for an inverted result, the result and the inverted result together indicating an output operand; a first circuit branch with a first logic assembly, which is coupled to the first and second inputs and the first partial output to calculate the result; a second circuit branch with a second logic assembly, which is coupled to the first and second inputs and the second partial output to calculate the inverted result, respectively; wherein the first logic assembly and the second logic assembly have different run times for calculating the result and the inverted result; and a delay circuit in the first and/or second circuit branch to decrease a difference of the run times of the first and the second circuit branch.

In accordance with a second aspect, the invention provides a logic circuit, having: an input for one or several input operands; an output for a result or an inverted result; a first circuit branch with a first logic assembly, which is coupled to the input and the output to calculate the result; a second circuit branch with a second logic assembly, which is coupled to the input and the output to calculate the inverted result; wherein the first logic assembly and the second logic assembly have different power consumptions for calculating the result and the inverted result, respectively; and a compensation circuit in the first and/or second circuit branch to decrease a difference of the power consumption of the first and the second circuit branch.

The present invention is based on the knowledge that the security of circuits, such as particularly cryptographic circuits, such as in chip cards or SIM cards, against hardware attacks, such as power and timing attacks, can be increased when these circuits are constructed of logic circuits, where the circuit branch with the logic assembly for the calculation of the result and the circuit branch with the logic assembly for calculating the inverted result are equalized and homogenized, respectively, with regard to their run times and power consumption, respectively, by providing a delay circuit or compensation circuit in one or both of the circuit branches, which decreases the difference of the power consumptions and run times of these logic assemblies, respectively, or compensates them fully. Thereby, a lower variation of the power consumption and required run time in dependency on the input operands to be processed is obtained with only a low circuit technical effort, since the run time and the power consumption, respectively, which occurs when the one circuit branch switches, differs less from the run time and power consumption, respectively, which occurs in the case when the other circuit branch switches. By the lower difference and the lower variation, respectively, with regard to the run times and power consumption, the danger of the success of power and timing attacks, respectively, by attackers is reduced significantly.

A specific embodiment of the present invention relates to asynchronous self-clocked circuits and particularly to such circuits, which have been synthesized according to the NCL logic. By the equalization/homogenization of the time behavior and the power consumption, respectively, of the individual, so-called "full function" implementing logic circuits, the security of a cryptographic circuit comprised of these logic circuits against timing and power attacks, such as DPA attacks, can be increased significantly. The cryptographical circuit implements, for example, a symmetrical cryptographical algorithm, such as a DES (data encryption standard) or AES (advanced encryption standard) algorithm or an asymmetrical one, such as the RSA algorithm.

BRIEF DESCRIPTION OF THE DRAWINGS

In the following, preferred embodiments of the present invention will be discussed in more detail with reference to the accompanying drawings. They show:

FIG. 4 a circuitry of a logic circuit with regard to which the disadvantage of the prior art logic circuitry is illustrated.

Figure 1:
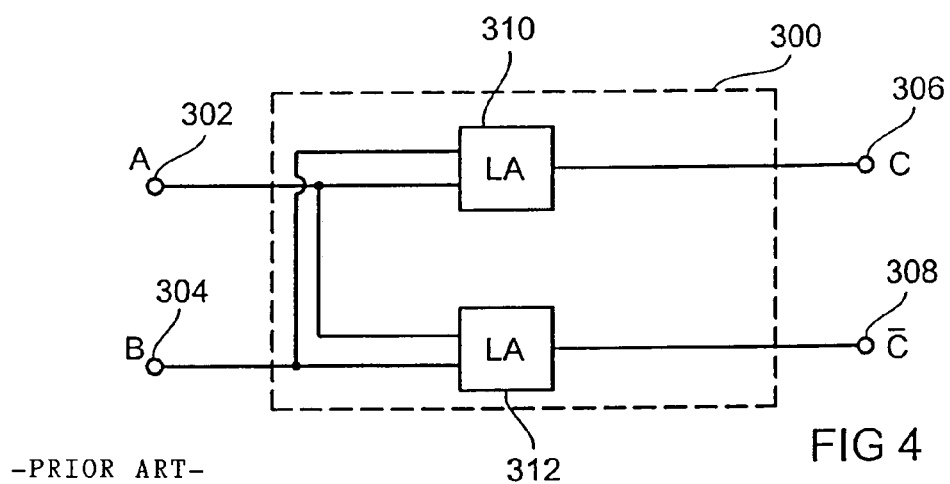
FIG. 1 a general embodiment of a logic circuit according to the present invention.
Figure 1:
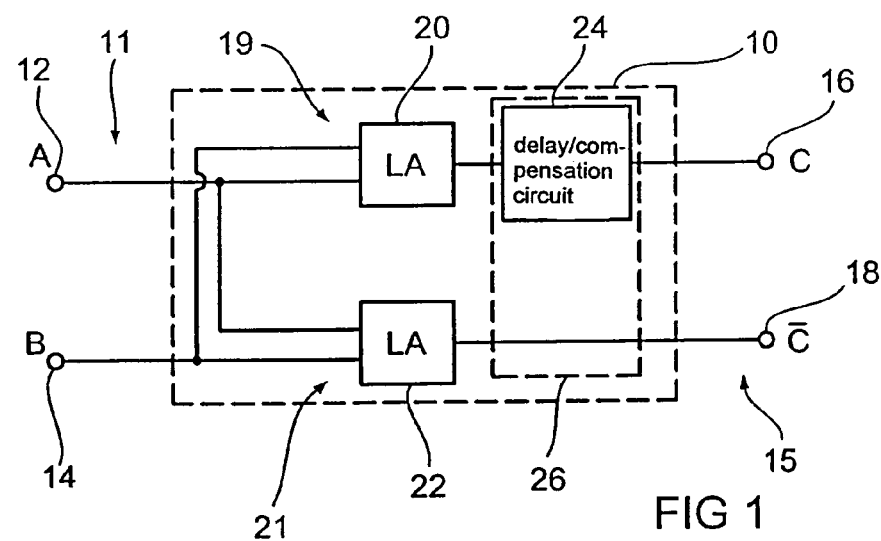

DESCRIPTION OF PREFERRED
EMBODIMENTS

It should be noted that the same or functionally equal elements are indicated with the same or similar reference numbers in FIGS. 2 and 3, and that a repeated description of these elements is omitted in the following description of these Figures.

First, a logic circuit according to a general embodiment of the present invention is described with reference to FIG. 1, where the logic circuit, like the one of FIG. 4, maps two input operands A, B to a result operand C, and outputs a result C and an inverted result $\overline{C}$. The logic circuit of FIG. 1, which is generally indicated with 10, comprises an input 11 with an operand input 12 for the input operand A and an operand input 14 for the input operand B on the input side, an output 15 with a partial output or sub output 16 for the result C and a partial output 18 for the inverted result $\overline{C}$ on the output side, as well as in-between a circuit branch 19 coupled to the input 11 and the partial output 16, which comprises a logic assembly 20, and a circuit branch 21 coupled to input 11 and partial output 18, which comprises a logic assembly 22. Both logic assemblies 20 and 22 are coupled both with the operand input 12 and the operand input 14.

The logic assemblies 20 and 21 are designed such that they cooperate according to a logic function of the logic circuit 10 to calculate a result C and an inverted result $\overline{C}$, respectively, from the input operands A and B, which is determined by the logic function. The logic function is, for example, an OR, AND or XOR function or a more complicated function comprised of these functions. Every logic assembly 20 and 22, respectively, has a different run time and power consumption, respectively, for its respective calculation, which results, for example, from a different number of internal logic states and generally from a different construction of gates. In other words, a switching operation for the result C requires a different run time and power consumption than a signal passing through the logic assembly 22.

In the present case of FIG. 1, it is exemplarily assumed that the logic assembly 20 has a shorter run time and a lower power consumption than the logic assembly 22. Thus, for decreasing the difference between the run times and the power consumptions of the two logic assemblies 20 and 22, a circuit 24, which itself has a run time and a power consumption, is provided or switched in series into the circuit branch 19. Thus, the run time and power consumption of the circuit branch 19 is now comprised of the run times of the logic assembly 20 and the circuit 24. Similarly, the power consumption of the circuit branch 19 is comprised of the power consumption of the logic assembly 20 and the power consumption of the circuit 24. Thus, the circuit 24 serves as delay circuit and compensation circuit in one. In the ideal case, the circuit 24 is laid out such that the sum of the run times of the logic assembly 20 and the circuit 24 and thus the run time of the circuit branch 19 is equal to the run time of the circuit branch 21. In a similar way, the circuit 24 would be ideally laid out when the sum of the power consumptions of the logic assembly 20 and the circuit 24 would be equal to the power consumption of the circuit branch 21. The circuit 24 has no function in the logical sense, i.e. does not change the logic state for the result C at the partial output 16 calculated by the logic assembly 20.

Due to the equalization/homogenization of the timing and power consumption behavior of the logic circuit 10 caused by the circuit 24, it is made difficult for attackers to obtain information by hardware attacks, which are based, for example, on timing, current consumption measurements or radiation measurements, which are processed with the help of a cryptographical algorithm which is implemented by a circuit into which the logic circuit 10 of FIG. 1 is inserted.

While the logic assemblies 20 and 22 have been illustrated in FIG. 1 as fully separated from one another for the ease of understanding, the present invention is also applicable to logic circuits were the logic assemblies have a common part for the result and the inverted result, respectively, but differ otherwise.

Further, it should be noted that the previous description of FIG. 1 is applicable both to a synchronously clocked as well as to an asynchronously self-clocked implementation of the logic circuit 10. In the case of synchronously working, clocked logic assemblies 20 and 22, the input operands A and B are, for example, individual bits, which are transmitted from the operand inputs 12 and 14 to the logic assemblies 20 and 22 via simple lines, and mapped there to the result C and the inverted result C̄, respectively, depending on the logic function of the logic circuit 10, which are output with a logical state of true or false at the partial outputs 16 and 18, respectively. The run time differences of the logic assemblies 20 and 22 could, for example, be a fraction of a clock, which would be reduced by the delay circuit 24. In a similar way, a difference in the power consumption of the two logic assemblies 20 and 22 could be compensated and reduced, respectively, by the compensation circuit 24.

In order to equalize and homogenize, respectively, the power consumption in run times more finely, and, at the same time, to take into account the fact that providing a circuit in a power branch, which equalizes the power consumption, means, at the same time, an increase of the run time, a circuit 26 shown in dashed lines in FIG. 1 can be switched both into the circuit branch 19 as well as the circuit branch 21 instead of the circuit 24 in order to operate on both circuit branches 19 and 21 at the same time, without effect on the logic function of the two circuit branches 19 and 21, such that an equalization and homogenization of the power consumption and run time of the two circuit branches 19 and 21 is effected.

After a general embodiment for a logic circuit has been described above with reference to FIG. 1, in the following, special embodiments for logic circuits of the type of FIG. 1 are described with reference to FIGS. 2 and 3, with reference to FIG. 2 a gate implementing an AND function and with reference to FIG. 3 a gate implementing an OR function according to the NCL logic.

Before reference is made to FIGS. 2 and 3, the zero convention logic and NCL logic, respectively, of the company Theseus Logic Inc. is briefly discussed in the form as is underlying the embodiments of FIGS. 2 and 3, wherein for further details, reference is made to the article "NULL CONVENTION LOGIC" by D. N. Fant and S. A. Brandt, which can be retrieved on the internet page of Theseus "http://www.theseus.com/_aboutncl.htm" by a link in PDF format and is included here with reference to the form of the NCL logic described below.

According to the NCL logic, a DATA function is only assigned to one of two state values, which a binary logical state can take on on a data line, while the respective other state value is referred to as NULL, and indicates the absence of a DATA value. DATA are transmitted on a data line, for example, with a state of electrically high potential and high voltage, respectively, such as 5 V or 3,5 V, while NULL is transmitted with a state of electrically low potential and with a low voltage, respectively, such as 0 V. Since merely DATA or NULL, i.e. only one logical value can be transmitted on a single data line, two lines and rails, respectively, are used for transmitting binary operands. Per definition, a DATA value, i.e. a state of electrically high potential, is assigned to the logical value FALSE (F) of a binary operand on a first rail and line, respectively, which is illustrated in the figures described below with a circle at the rail and referred to as F or 0 rail, and a NULL value, i.e. a state of electrically low potential on the second rail, which is referred to as T or 1 rail. Accordingly, the inverse combination of states is assigned to the logic value TRUE (T) on the rails transmitting the respective operand, namely a state value DATA on the second T rail and a state value NULL on the first F-rail.

The NCL logic is an asynchronous logic and distinguished by the fact that no general clock is necessary for its operation. This is mainly achieved by introducing an additional value NULL (N) into the logical values F and T. Every operand or its transmitting dual rail line can consequently take on one of three different values. Per definition, the combination of logical states is assigned to the additional value N on the two rails transmitting the respective operand, where both logic states have the value NULL and are set to an electrically low potential, respectively.

Since merely one data value DATA in otherwise merely NULL, which means no data, can be transmitted on one rail, the only distinguishable quantity in the NCL logic for a logic gate in the case of several input rails is, how many DATA values are transmitted on the rails. Consequently, NCL® circuits are merely made up of discrete threshold gates, two different embodiments (indicated with "22" and "13") of which, are shown in FIGS. 2 and 3. Discrete threshold gates have N inputs and one output. An N of M gate or N out of M gate(expressed in FIGS. 2 and 3 by two numbers within the gate, the first of which indicates N and the second M), has the property to output the value DATA at the output, when the value DATA is present on the same number as N or more than N of the M outputs. Otherwise, it outputs a NULL value.

Due to the above measures according to the NCL logic, i.e. providing the additional value NULL for an operand and constructing the gates as discrete threshold gates, it is possible to construct an asynchronous self-clocked circuit of NCL®-logic gates, which map two input operands on one output operand. Appropriately constructed NCL gates are formed such that they, beginning from a state where all input operands have the value NULL, only output a logical value (F or T) when all input operands have changed to a logical value (T or F). This ensures that it can be realized at the end of a circuit made up of these logic devices whether the full result, which is based on a full set of input operands, is applied at the output.

On the other hand, it is ensured in the NCL logic that a NULL cycle takes place prior to the beginning of the next calculating cycle, where all input operands are set to the value NULL, so that a downstream receiver can recognize on the basis of the received result signal when a new and particularly valid value is present. Therefore, the logic devices according to the NCL logic are constructed such that they change from a logical result value (F or T) to the value NULL only when all input operands have changed to the value NULL. According to the form of the NCL logic described below with reference to FIGS. 2 and 3, this is performed by a special construction of the N of M gates. These are constructed such that they show a hysteresis effect. Such N of M gates change from a value NULL to a value DATA at their output when at least N of the M inputs have the value DATA. However, these N of M gates only change to the result value NULL, when all input values are NULL. Otherwise, the gate remains in its present state.

Obtaining the hysteresis effect in the N of M gates according to the NCL logic in the above-described form can, for example, be obtained by a feedback circuit. Thereby, an N of M gate comprises N−1 further internal inputs apart from the M external inputs, which are connected to the output of the N of M gate. If the result value of the N of M gate has taken on the value DATA, this value is applied N−1 times at the input and at N−1 internal inputs of the N of M gate, respectively. The number of inputs, external or internal, which have the value DATA is thus larger than or equal to N as long as only one of the external M inputs has the value DATA, since during this time, at least the N−1 DATA values fed back are present at the internal inputs. Only when all input values at the M external inputs have taken on the value NULL, the result value of the N of M gate also changes to the value NULL. Further information about the construction and the behavior of threshold gates with hysteresis effects according to the NCL logic in the form described herein can be retrieved from the article "CMOS Circuit Design of Threshold Gates with Hystereses" by G. E. Sobelman and K. F. Fant, which can be fetched from the above-mentioned internet page of the company Theseus by a link in PDF format, and which is included herein by reference. Another possible form of the NCL logic not used in FIGS. 2 and 3 provides the usage of two dual rail lines per input operands with two logical states T and F.

In the examples for NCL, AND and OR gates, respectively, described with reference to FIGS. 2 and 3, the property that it is only switched from a logical value T or F to the value NULL at the output of the gate when all input operands are NULL, is ensured by the fact that every combination of two rails of the four rails of the two input operands in total, more precisely every combination of a rail of the first input operand and a rail of the other input operand are input into a 2 of 2 gate with hysteresis effect, which will be discussed below in more detail.

By the two properties of the NCL logic described above, namely outputting a logical value only when all input operands have a logical value and ensuring the completeness of the input criteria for the data in relation to NULL and the returning to the NULL output value only when all input operands are NULL again, respectively, and ensuring the completeness of the input criteria for NULL in relation to the data, respectively, it is guaranteed that a circuit constructed on such logic devices can manage without a common tact and is thus almost insensitive against power dependent delays (delay insensitive) (due to the feedback to the hysteresis generation, a non-critical time relation exists).

After the main characteristics of the NCL logic in the form relevant herein have been described above, reference will now be made to FIGS. 2 and 3.

Figure 2B:
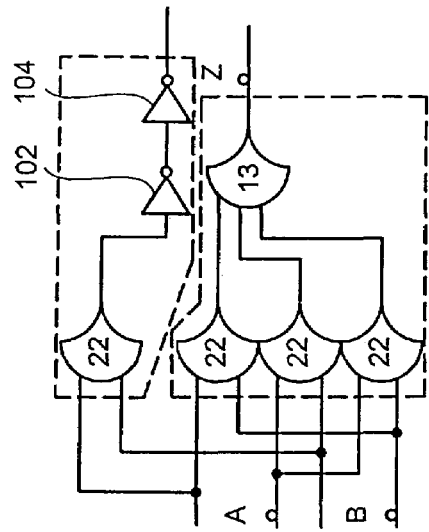
FIG. 2b an NCL-AND gate implemented according to an embodiment of the present invention.
Figure 2A:
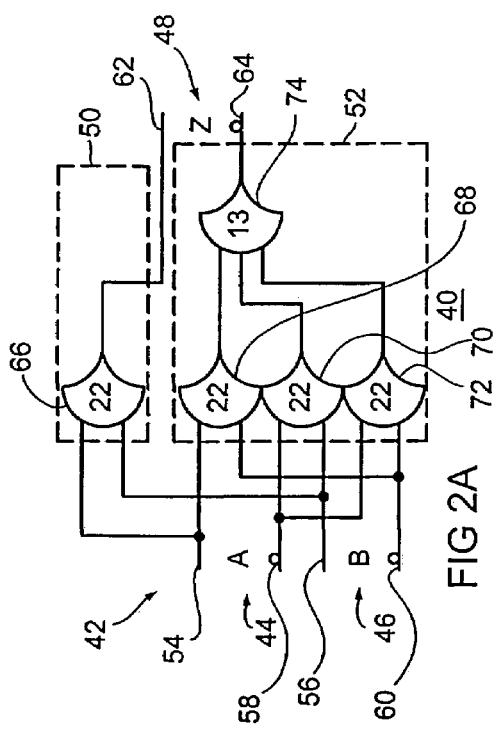
FIG. 2a an NCL-AND gate not implemented according to the present invention.

FIG. 2a shows a NCL dual rail AND gate, which is constructed according to the NCL logic in the above-described form, which maps the input operands A and B to the output operand Z after an AND operation, but which does not correspond to the present invention. The gate shown in FIG. 2a, is, for example, illustrated on the Internet page of the company Theseus mentioned above. After the explanation of FIG. 2a, a corresponding AND gate, which has an inventive improvement, will be described with reference to FIG. 2b.

The AND gate of FIG. 2a, which is generally indicated with reference 40, comprises an input 42 with a dual rail input 44 for a binary logical input operand A and a dual rail input 46 for a binary logic input operand B on the input side, a dual rail output 48 on the output side as well as in between a circuit branch and path, 50, respectively, and a second circuit branch and path, 52, respectively, which are both coupled to the input 42 and the dual rail output 48. Particularly, every dual rail input 44 and 46, respectively, comprises an input for a first T rail 54 and 56, respectively, and an input for a second F rail 58 and 60, respectively. Accordingly, the dual rail output 48 comprises an output for a first T rail 62 and a second F rail 64. The respective first T and 1 rail 54, 56 and 62, respectively, correspond, as mentioned above, to the rail of a dual rail line for the transmission of an operand, where a value DATA is transmitted, when the respective operand has the logical value T while the other transmits NULL. Accordingly, the second F and 0 rails 58, 60 and 64, respectively, which are shown in FIGS. 2a, 2b, 3a and 3b by a small circle on the respective rail, correspond to the rail of a dual rail line on which it is shown by a value DATA that the operand transmitted on this dual rail line has a logical value of F, while the other transmits NULL.

The first logic path 50 comprises a 2 of 2 gate 66 of the above-described type with hysteresis effect. The logic path 50 is particularly coupled to the input 42 and the dual rail output 48 such that the two inputs of the 2 of 2 gate 66 are connected to the two 1 rails of the operands A and B and the output of the 2 of 2 gate 66 is connected to the 1 rail 62 of the output operand Z. The second logic path 52 consists of three 2 of 2 gates 68, 70 and 72, and a 1 of 3 gate 74, which are all of the same type as the gate 66. Internally, i.e. within the path 52, the outputs of the 2 of 2 gates 68, 70 and 72 are connected to the three inputs of the 1 of 3 gate 74. The logic path 52 is coupled to the input 42 and the dual rail output 48 such that the two inputs of the gate 68 are connected to the 1 rail 54 and the 0 rail 60, the two inputs of the gate 70 are connected to the 0 rail 58 and the 1 rail 56, and the gate 72 is connected to the 0 rail 58 and the 0 rail 60 and the output of the gate 74 is connected to the 0 rail 64.

After the construction of the AND gate of FIG. 2a has been described above, its mode of operation will be discussed below. As can be seen for a person skilled in the art, the gates 66–72 correspond in their function approximately to the one of an AND gate after binary logic and thus form so-called "minterms" of the input operands A and B and their inverse $\overline{A}$ and $\overline{B}$, respectively. The gate 66, for example, only outputs the value DATA to the 1 rail 66 at its output, when a data value is present on both 1 rails 54 and 56. Here, it should be noted that according to an NCL logic at the most one value of a rail of a dual rail line of an operand can have a value DATA. This means that gate 66 only outputs a data value at its output when both input operands have a logical value T.

The gates 68–72 of the second logic path 52 form the other minterms and link the other combinations of rails, respectively, between the two input operands A and B. Due to the fact that, as mentioned above, at the maximum only one rail of a dual rail line can have a value DATA, at the most one of the gates 66–72 outputs a value DATA. If, accordingly, the gate 66 of the first logic path outputs a value DATA, the value output by the gates 68–72 is NULL. In this case, the gate 74 also outputs the value NULL at the 0 rail 74. In the case that one of the gates 68–72 outputs a value DATA, since the respective rails connected to this gate have the value DATA, while the other two are NULL, the 1 of 3 gate 74 also outputs the value DATA while the gate 66 outputs NULL. All in all, consequently, the two logic paths 50 and 52 cooperate to fulfill the logic function of gate 40, namely the AND function with regard to the two input operands A and B with the output operand Z.

As has already been mentioned above, the presence of the value DATA at one of the two rails 62 and 64 at the output 48 means that 1) the output operand has a logical value, 2) by convention the state value at the respective other rail of the output 48 is NULL, and that 3) particularly the input operands A and B have a logical value. The latter can be recognized by the fact that on the one hand at the most one of the gates 66–72 can output a value DATA, and that, on the other hand, at least one of the gates 66–72 has to output a value DATA, so that the output operand Z has a logical value. This means, on the other hand, that in the case of an output operand with a logical value exactly one rail of every input operand A and B has a value DATA, while the respective other has a value NULL. Thus, a receiver of the output operand Z can be sure when receiving a logical value, that this is based on logical values of the input operands A and B and is thus valid. The other way round, the output operand of the logic gate 50 changes due to the hysteresis properties of the gates 66–74 of the output operand only from a logical value to the value NULL, when both input operands A and B have taken on the value NULL, since that "minterm" gate 66–72, which outputs data at the output, only changes to NULL when both incoming rails become NULL and both input operands A and B take on the value N, respectively.

Accordingly, the logic circuit illustrated in FIG. 2*a* represents a full "function", in this case an AND function, of two input operands A and B. Another example of such a logic circuit implementing a logic function is shown in FIG. 3*a*, which implements an OR function with regard to two input operands A and B with the output operand Z. In FIG. 3*a*, the same reference numbers were used as in FIG. 2*a*, supplemented by an apostrophe, to illustrate that the construction of the logic circuit of FIG. 3*a* differs from the one of FIG. 2*a* merely in that every 1 rail has been turned into a 0 rail and every 0 rail into a 1 rail, whereby, as it is easily understood by a person skilled in the art, an OR function is realized from the AND function of the circuit of FIG. 2*a*.

As can be seen from FIGS. 2*a* and 3*a*, the numbers of logic stages within the logic paths of the logic device differ. The logic path 52 and 52', respectively, comprises two logic stages, while the other logic path 50 and 50', respectively, merely comprises one logic stage. Due to this effect, the logic paths of these logic devices have differing run times and power consumptions. Accordingly, depending on which of the logic paths, i.e. the 1 rail or the 0 rail of the output operand Z, changes to the data or zero value, the required time length and power consumption for the calculation differs. Which of the two logic paths switches and which value the output operand Z takes on, respectively, does dependent again on the values of the input operands according to a logic function, i.e. AND and OR, respectively. Accordingly, a circuit which is constructed of the logic devices of FIG. 2*a* and FIG. 3*a* requires a different total time length and total power consumption, respectively, depending on input operand and input operands, respectively, for the calculation of the respective output operand and output operands, respectively, wherein the differences in the run times and power consumptions, which cause the different input operands in the logic devices, add up and result in the total difference with regard to the power consumption and duration.

Accordingly, in the case of a circuit which is constructed of logic gates 2*a* and 3*a* and implements part of cryptographical algorithm, it is possible for an attacker to obtain conclusions about secret information about the data processed via the cryptographical algorithm based on measurements about the total power consumption and the total calculating time.

Figure 3B:
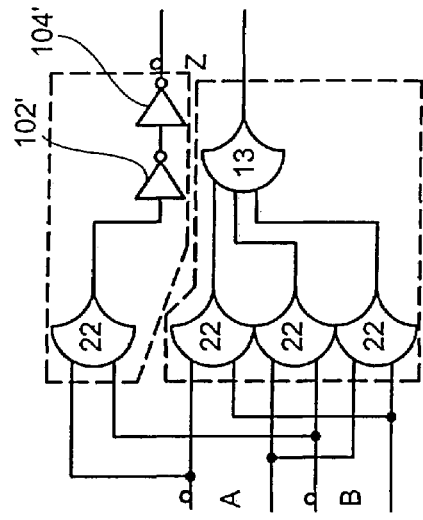
FIG. 3b an NCL-OR gate implemented according to an embodiment of the present invention.
Figure 3A:
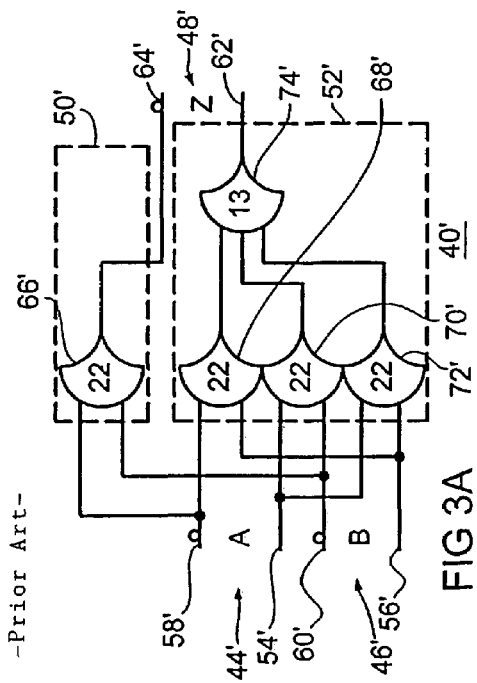
FIG. 3a an NCL-OR gate not implemented according to the present invention.

According to a specific embodiment of the present invention, the danger that such hardware attacks are successful is reduced by connecting a circuit into the respective shorter logic path, which causes a delay and additional run time, respectively, and an additional power consumption, as it is shown in FIGS. 2*a* and 3*b*. Accordingly, FIG. 2*a* illustrates a NCL dual rail AND gate according to an embodiment of the present invention, which is generally indicated with 100, and which merely differs from the one in FIG. 2*a* by the fact that two inverters 102 and 104 are connected in series in the logic path 50 between the output of gate 66 and the output of 1 rail 62. These inverters 102 and 104 cause obviously no logic function, but merely an increase of the run time and an increase of the power consumption of the respective logic path 50. In this way, the run time and the power consumption of the logic path 50 are equalized to the one of the logic path 52, since the run time and power consumption caused by gate 66 are supplemented by the run times and power consumptions of the inverters 102 and 104.

Accordingly, FIG. 3*b* shows an embodiment of an NCL dual rail OR gate according to the present invention, which merely differs from the one in FIG. 3*a* by the fact that two inverters 102' and 104' are connected in series in the single stage logic path 50'. The circuits of FIGS. 2*b* and 3*b* again merely differ by the renaming of every 1 rail into a 0 rail and the other way round.

Compared to an asynchronous circuit, which is constructed of logic gates according to FIGS. 2*a* and 3*a*, an asynchronous circuit, which is constructed based on the logic gates of FIGS. 2*b* and 3*b*, experiences less variation with regard to run time and the required power consumption in changing input variables and operands, respectively. In the case that the circuit constructed in this way implements a cryptographical algorithm or a partial operation of it, an attacker can accordingly only detect slight variations in the run times and power consumptions, whereby the danger of a successful attack is effectively reduced. In the ideal case, where the inverter 102 and 104 cause a complete balance between the run times and power consumptions of the two logic paths, i.e. the one logic path for the one rail and the other logic path for the other rail, and this for all logic gates, of which the asynchronous cryptocircuit is constructed, the attacker can derive no information at all from the total power consumption and the total calculating time, since it is ensured above that by the NCL logic that every operand is always illustrated by a DATA value and a NULL value independent of its logical value, i.e. always by a high and a low level.

In other words, the embodiments of FIGS. 2*b* and 3*b* provide examples how the susceptibility of asynchronous self-clocked circuits, which have been synthesized according to the NCL method, particularly of functions that are extended to so-called "full functions" due to the dual rail construction of this logic, can be reduced. This was realized in these embodiments by inserting a buffer into the path which performs the actual "function", with a single stage circuitry, which delays the signal in this path so far that according to timing as well as according to the power consumption no or at least a significantly lower difference exists as without the buffer in reference to the path, which is given by combining the other "minterms" with a two-stage circuitry. By inserting the buffer, an equalization/homogenization of the time behavior of the "full function" results.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A logic circuit, comprising:
    a first input for a first input operand;
    a second input for a second input operand;
    an output with a first partial output for a result and a second partial output for an inverted result, the result and the inverted result together indicating an output operand;
    a first circuit branch with a first logic assembly, which is coupled to the first and second inputs and the first partial output to calculate the result;

a second circuit branch with a second logic assembly, which is coupled to the first and second inputs and the second partial output to calculate the inverted result, respectively;

wherein the first logic assembly and the second logic assembly have different run times for calculating the result and the inverted result; and a delay circuit in the first and/or second circuit branch to decrease a difference of the run times of the first and the second circuit branch.

2. The logic circuit according to claim 1, wherein the delay circuit comprises two inverters connected in series in one of the logic branches.

3. The logic circuit according to claim 1, wherein every operand can take on one of two logical values and an additional value, and wherein the first and the second logic assembly are equalized such that they cooperate to calculate an output operand with a logical value in a case when all input operands have a logical value, and to calculate an output operand with the additional value in a case when all input operands have the additional value.

4. The logic circuit according to claim 3, wherein the first and the second logic assembly are equalized such that the output operand only changes from the calculated logical value to the additional value when all input operands take on the additional value.

5. The logic circuit according to claim 1, wherein the first circuit branch is connected to the first partial output, and the second circuit branch is connected to the second partial output.

6. The logic circuit according to claim 5, wherein the first and the second logic assembly are equalized such that when all input operands have a logical value, the result and the inverted result are indicated by binary states at the partial outputs, which comprise different state values of a first and second state value, and when all input operands have an additional value, the result and the inverted result are indicated at the partial outputs by binary states, which comprise a predetermined state value of the first and the second state value.

7. The logic circuit according to claim 1, wherein the first and the second logic assemblies are constructed of discrete threshold gates, which comprise a plurality of inputs for receiving binary states and an output for outputting a binary state and are equalized to set the binary state at the output of the discrete threshold gate to a second state value, when more than one discrete threshold of binary states at the inputs of the discrete threshold gate have the second state value and otherwise to the first state value.

8. The logic circuit according to claim 7, wherein the discrete threshold gates are equalized to set the binary state at the output of the discrete threshold gate from the first state value to the second state value, when more than one discrete threshold of binary states at the inputs of the discrete threshold gate have the second state value, and to set the binary state at the output of the second state value to the first state value, when all binary states at the inputs of the discrete threshold gate have the first state value, and to otherwise leave the binary state unchanged.

9. The logic circuit according to claim 1, wherein the logic circuit works self-clocked.

10. The logic circuit according to claim 1, wherein the input comprises an operand input for every input operand, each of which is coupled to the first and the second circuit branch, and wherein every operand input has two partial inputs for receiving two binary states with either a first state value or a second state value, which indicate in combination a value of the respective input operand, and wherein every circuit branch is connected to at least one partial input of every operand input.

11. The logic circuit according to claim 10, wherein every input operand has a first logical value, when the binary state at a first of the two partial inputs of the respective operand input comprises one of the first and second state values, and the other partial input comprises the other of the first and second state values, and a second logical value, when the binary state comprises the other of the first and second state values at the first partial input and the binary state comprises the one of the first and second state values at the second partial input, and an additional value, when the binary states comprise predetermined state values at the two partial inputs.

12. A logic circuit according to claim 1, wherein the delay circuit is serially connected between the first logic assembly and the first partial output or serially connected between the second logic assembly and the second partial output.

13. A logic circuit, comprising:
an input for one or several input operands;
an output for a result or an inverted result;
a first circuit branch with a first logic assembly, which is coupled to the input and the output to calculate the result;
a second circuit branch with a second logic assembly, which is coupled to the input and the output to calculate the inverted result;

wherein the first logic assembly and the second logic assembly have different power consumptions for calculating the result and the inverted result, respectively; and a compensation circuit in the first and/or second circuit branch to decrease a difference of the power consumption of the first and the second circuit branch.

14. The logic circuit according to claim 13, wherein the compensation circuit comprises two inverters connected in series in one of the logic branches.

15. The logic circuit according to claim 13, wherein every operand can take on one of two logical values and an additional value, and wherein the first and the second logic assembly are equalized such that they cooperate to calculate an output operand with a logical value in a case when all input operands have a logical value, and to calculate an output operand with the additional value in a case when all input operands have the additional value.

16. The logic circuit according to claim 15, wherein the first and the second logic assembly are equalized such that the output operand only changes from the calculated logical value to the additional value when all input operands take on the additional value.

17. The logic circuit according to claim 13, wherein the first circuit branch is connected to the output, and the second circuit branch is connected to the output.

18. The logic circuit according to claim 17, wherein the first and the second logic assembly are equalized such that when all input operands have a logical value, the result and the inverted result are indicated by binary states at the output, which comprises different state values of a first and second state value, and when all input operands have an additional value, the result and the inverted result are indicated at the output by binary states, which comprise a predetermined state value of the first and the second state value.

19. The logic circuit according to claim 13, wherein the first and the second logic assemblies are constructed of discrete threshold gates, which comprise a plurality of inputs for receiving binary states and an output for outputting a binary state and are equalized to set the binary state at the output of the discrete threshold gate to a second state value, when more than one discrete threshold of binary states at the inputs of the discrete threshold gate have the second state value and otherwise to the first state value.

20. The logic circuit according to claim 19, wherein the discrete threshold gates are equalized to set the binary state at the output of the discrete threshold gate from the first state value to the second state value, when more than one discrete threshold of binary states at the inputs of the discrete threshold gate have the second state value, and to set the binary state at the output of the second state value to the first state value, when all binary states at the inputs of the discrete threshold gate have the first state value, and to otherwise leave the binary state unchanged.

21. The logic circuit according to claim 13, wherein the logic circuit works self-clocked.

22. The logic circuit according to claim 13, wherein the input comprises an operand input for every input operand, each of which is coupled to the first and the second circuit branch, and wherein every operand input has two partial inputs for receiving two binary states with either a first state value or a second state value, which indicate in combination a value of the respective input operand, and wherein every circuit branch is connected to at least one partial input of every operand input.

23. The logic circuit according to claim 22, wherein every input operand has a first logical value, when the binary state at a first of the two partial inputs of the respective operand input comprises one of the first and second state values, and the other partial input comprises the other of the first and second state values, and a second logical value, when the binary state comprises the other of the first and second state values at the first partial input and the binary state comprises the one of the first and second state values at the second partial input, and an additional value, when the binary states comprise predetermined state values at the two partial inputs.

24. A logic circuit according to claim 13, wherein the compensation circuit is serially connected between the first logic assembly and the output or the second logic assembly and the output.

* * * * *

UNITED STATES PATENT AND TRADEMARK OFFICE
CERTIFICATE OF CORRECTION

| | | |
|---|---|---|
| PATENT NO. | : 7,132,858 B2 | |
| APPLICATION NO. | : 11/018404 | |
| DATED | : November 7, 2006 | |
| INVENTOR(S) | : Holger Bock | |

It is certified that error appears in the above-identified patent and that said Letters Patent is hereby corrected as shown below:

At column 4, line 57, "were" should read --where--

At column 10, line 42, delete "no" after the word "consumption"

Signed and Sealed this

Thirtieth Day of January, 2007

JON W. DUDAS
*Director of the United States Patent and Trademark Office*